(12) United States Patent
Wada et al.

(10) Patent No.: US 11,685,998 B2
(45) Date of Patent: Jun. 27, 2023

(54) SUBSTRATE PROCESSING APPARATUS, STORAGE MEDIUM AND SUBSTRATE PROCESSING METHOD

(71) Applicant: ASM IP Holding B.V., Almere (NL)

(72) Inventors: Takashi Wada, Sagamihara (JP); Satoru Noguchi, Tokyo (JP); Wataru Adachi, Kawasaki (JP); Daisuke Muramatsu, Tama (JP)

(73) Assignee: ASM IP Holding B.V., Almere (NL)

( * ) Notice: Subject to any disclaimer, the term of this patent is extended or adjusted under 35 U.S.C. 154(b) by 74 days.

(21) Appl. No.: 16/014,320

(22) Filed: Jun. 21, 2018

(65) Prior Publication Data
US 2019/0390345 A1 Dec. 26, 2019

(51) Int. Cl.
*C23C 16/52* (2006.01)
*C23C 16/455* (2006.01)

(52) U.S. Cl.
CPC ........ *C23C 16/52* (2013.01); *C23C 16/45525* (2013.01)

(58) Field of Classification Search
CPC .......................... C23C 16/52; C23C 16/45525
USPC ...................... 118/715–733; 427/248.1–255.7
See application file for complete search history.

(56) References Cited

U.S. PATENT DOCUMENTS

| | | | | |
|---|---|---|---|---|
| 6,228,420 B1* | 5/2001 | Lin | .................. | C23C 16/448 427/248.1 |
| 6,656,831 B1* | 12/2003 | Lee | .................. | C23C 16/34 257/E21.17 |
| 7,313,450 B1 | 12/2007 | Fu et al. | | |
| 2003/0049390 A1* | 3/2003 | Shanmugasundram | ..................... | C23C 16/52 427/585 |
| 2004/0067645 A1* | 4/2004 | Chen | .................. | H01L 21/67253 438/689 |
| 2005/0227499 A1* | 10/2005 | Park | .................. | H01L 21/02211 438/789 |
| 2010/0124726 A1 | 5/2010 | Sugishita et al. | | |
| 2010/0144145 A1* | 6/2010 | Takahata | ................. | C23C 16/52 438/680 |

(Continued)

FOREIGN PATENT DOCUMENTS

| | | |
|---|---|---|
| JP | 2010-118605 A | 5/2010 |
| JP | 2012-216639 A | 11/2012 |

(Continued)

OTHER PUBLICATIONS

An Office Action mailed by China National Intellectual Property Administration dated May 31, 2022, which corresponds to Chinese Patent Application No. 201910444402.3 and is related to U.S. Appl. No. 16/014,320 with English language translation.

(Continued)

*Primary Examiner* — Michael G Miller
(74) *Attorney, Agent, or Firm* — Studebaker & Brackett PC

(57) ABSTRACT

Examples of a substrate processing apparatus includes a device for subjecting a substrate to processing, and a controller for modifying a control parameter predetermined to control the device with a first modification value and a second modification value that vary over time, thereby calculating a modified parameter, and controlling the device based on the modified parameter, wherein the first modification value has a shorter term for modifying the control parameter than the second modification value.

13 Claims, 6 Drawing Sheets

(56) References Cited

U.S. PATENT DOCUMENTS

| | | | |
|---|---|---|---|
| 2011/0086184 A1* | 4/2011 | Okabe | ............... C23C 16/50 427/576 |
| 2012/0248067 A1 | 10/2012 | Ogi et al. | |
| 2015/0001181 A1 | 1/2015 | Ogi et al. | |
| 2017/0159175 A1 | 6/2017 | Yagi et al. | |
| 2018/0350638 A1 | 12/2018 | Kaga et al. | |
| 2020/0135506 A1 | 4/2020 | Kaga et al. | |
| 2020/0144082 A1 | 5/2020 | Kaga et al. | |

FOREIGN PATENT DOCUMENTS

| | | | | |
|---|---|---|---|---|
| JP | 6119400 B2 | 4/2017 | | |
| JP | 2017-101295 A | 6/2017 | | |
| WO | WO-2010042724 A2 * | 4/2010 | ............... | G01J 3/28 |
| WO | 2017/168675 A1 | 10/2017 | | |

OTHER PUBLICATIONS

An Office Action issued by Taiwan Intellectual Property Office dated Feb. 13, 2023, which corresponds to Taiwanese Patent Application No. 108118370 and is related to U.S. Appl. No. 16/014,320; with English language translation.

An Office Action; "Notice of Reasons for Refusal," mailed by the Japanese Patent Office dated Mar. 28, 2023, which corresponds to Japanese Patent Application No. 2019-096799 and is related to U.S. Appl. No. 16/014,320; with English language translation.

* cited by examiner

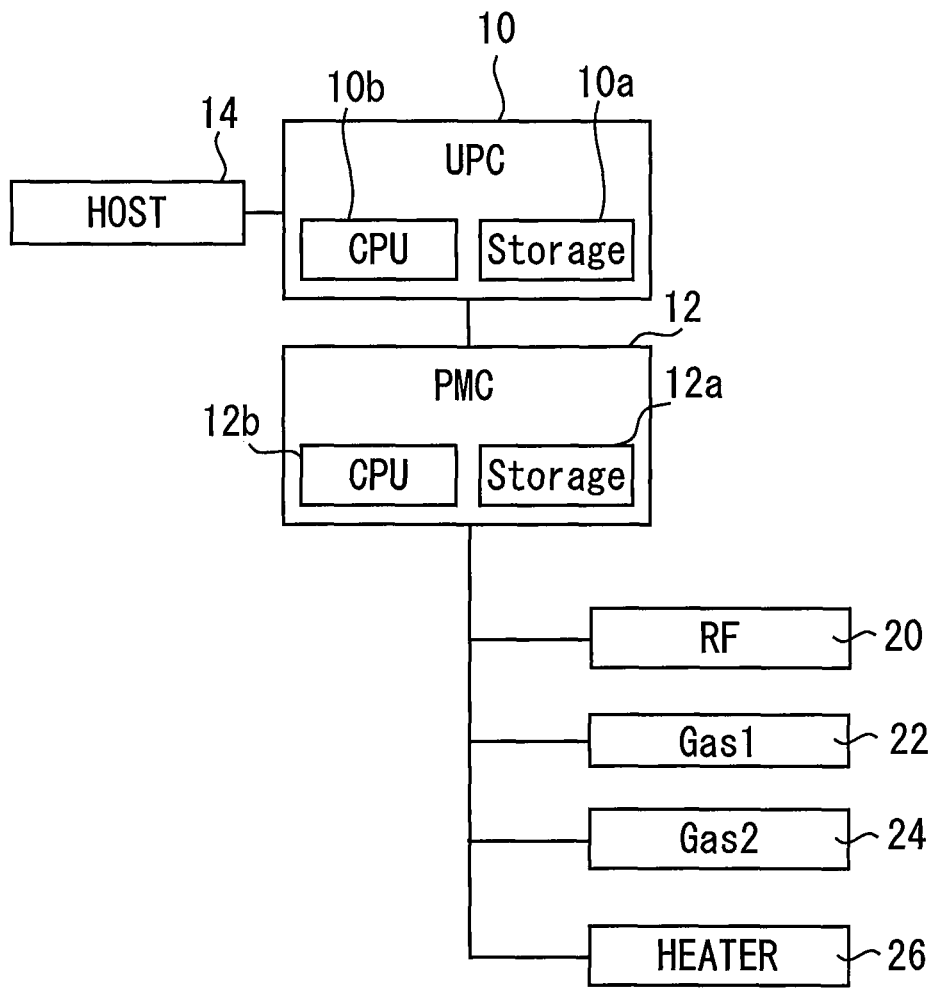

FIG. 3

Short term
Modification Table-variation expression

| Processing Count | 1 | 2 | 3 | 4 | ... |
|---|---|---|---|---|---|
| Shift Cycle1 | −2 | −1 | 0 | 1 | ... |
| HRF1 | +20% | +10% | ±0% | ±0% | ... |
| ... | ... | ... | ... | ... | ... |

FIG. 4

Short term
Modification Table-value expression

| Processing Count | 1 | 2 | 3 | 4 | ... |
|---|---|---|---|---|---|
| Shift Cycle1 | 105 | 104 | 103 | 102 | ... |
| HRF1 | +20% | +10% | ±0% | ±0% | ... |
| ... | ... | ... | ... | ... | ... |

FIG. 5

Short term
Modification Table-linear complement

| Total Thickness | 0 | 100 | 200 | 300 | ... |
|---|---|---|---|---|---|
| Shift Cycle1 | -2 | -1 | 0 | 1 | ... |
| HRF1 | +20% | +10% | ±0% | ±0% | ... |
| ... | ... | ... | ... | ... | ... |

FIG. 6

Long term
Modification Table-percentage expression

| Processing Count | 1 | 11 | 21 | 31 | ... |
|---|---|---|---|---|---|
| VT1 | +60% | +50% | +40% | +30% | ... |
| VC3 | +20% | +10% | ±0% | ±0% | ... |
| ... | ... | ... | ... | ... | ... |

SUBSTRATE PROCESSING APPARATUS, STORAGE MEDIUM AND SUBSTRATE PROCESSING METHOD

TECHNICAL FIELD

Examples are described which relate to a substrate processing apparatus, a storage medium and a substrate processing method.

BACKGROUND

JP 6,119,400 B discloses that parameters of a recipe are adjusted based on information of a film thickness so that the film thickness is constant at all times with respect to subsequent film formation processing. U.S. Pat. No. 7,313,450 B discloses a system for feeding back information of a measuring instrument to an apparatus to automatically change a recipe.

In the modification of the recipe based on the measurement information disclosed in JP 6,119,400 B and U.S. Pat. No. 7,313,450 B, it is impossible to change the recipe so as not to be affected by cleaning and pre-coat or waiting time occurs in chamber. As a result, after the substrate processing is started, an influence which finishes in a relatively short term would be exerted on the processing result.

SUMMARY

Some examples described herein may address the above-described problems. Some examples described herein may provide a substrate processing apparatus, a storage medium and a substrate processing method that can make a processing result of a substrate constant.

In some examples, a substrate processing apparatus includes a device for subjecting a substrate to processing, and a controller for modifying a control parameter predetermined to control the device with a first modification value and a second modification value that vary over time, thereby calculating a modified parameter, and controlling the device based on the modified parameter, wherein the first modification value has a shorter term for modifying the control parameter than the second modification value.

BRIEF DESCRIPTION OF THE DRAWINGS

FIG. 1 is a diagram showing an example of a configuration of a substrate processing apparatus;

FIG. 2 shows an example of a first modification value table;

FIG. 3 shows another example of the first modification value table;

FIG. 4 shows another example of the first modification value table;

FIG. 5 shows another example of the first modification value table;

FIG. 6 shows an example of a second modification value table;

DETAILED DESCRIPTION

Figure 7:
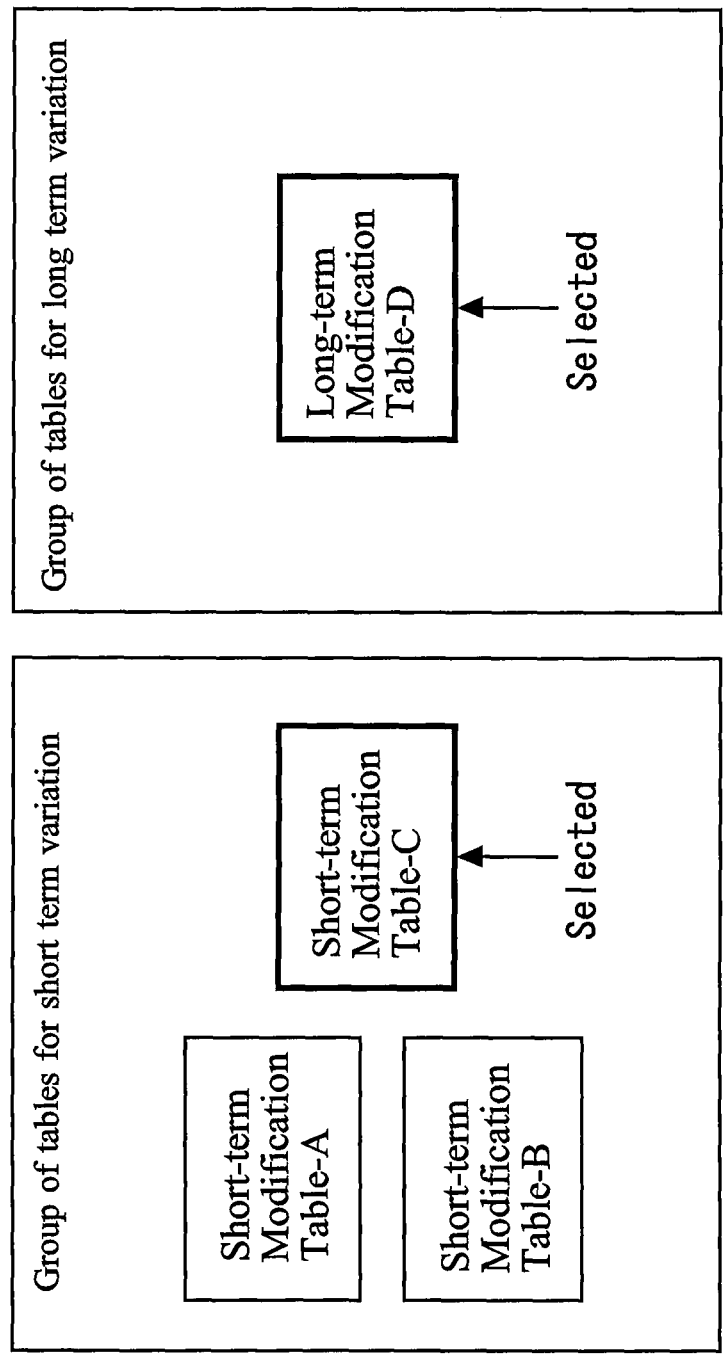
FIG. 7 is a diagram showing an example of a table stored in the storage medium.

A substrate processing apparatus, a storage medium and a substrate processing method according to some examples will be described with reference to the drawings. The same or corresponding constituent elements are represented by the same reference signs, and duplicative descriptions thereof may be omitted.

FIG. 1 is a diagram showing an example of a configuration of a substrate processing apparatus. The substrate processing apparatus of FIG. 1 may be, for example, an apparatus for forming a film on a substrate. This substrate processing apparatus includes a controller 10. The controller 10 is, for example, a Unique Platform Controller (UPC). The controller 10 is a part for performing scheduling of substrate processing, executing instructions of the substrate processing, etc. The controller 10 includes a storage medium 10a and a computer 10b. The storage medium 10a stores therein, for example, data on the configuration of the substrate processing apparatus, a recipe defining the processing content of a substrate, and information on environmental setting such as setting of the presence or absence of alarms and setting of a language. The controller 10 receives an instruction from a host computer 14. The controller 10 is connected to, for example, a controller 12 serving as a Process Module Controller (PMC). The controller 12 includes a storage medium 12a and a computer 12b.

Plural devices 20, 22, 24 and 26 are connected to the controller 12. The devices 20, 22, 24 and 26 perform processing on a substrate such as a silicon wafer, for example. In this example, the plural devices 20, 22, 24 and 26 are devices for forming a film on a substrate. The device 20 is, for example, an RF generator for performing plasma processing on a substrate. In this case, the device 20 applies high-frequency power to a plate placed above a susceptor called a well-known shower plate. The devices 22 and 24 are, for example, gas supply devices for supplying gas to a substrate. The device 26 is, for example, a heater for heating a substrate.

The controller 10 outputs an instruction to the controller 12, and the controller 12 receiving the instruction controls the devices 20, 22, 24 and 26. Control parameters predetermined to control the devices are stored in the storage medium 10a of the controller 10. The control parameters are process job recipes, for example. The controller 10 modifies the control parameter to calculate a modified parameter. The controller 10 modifies the control parameter, for example, with a first modification value and a second modification value that vary with time lapse, thereby calculating the modified parameter.

FIGS. 2 to 5 show examples of the first modification value. In the examples of FIGS. 2 to 5, the first modification value is expressed in the form of a table. FIG. 2 shows an example of a first modification value table. Processing Count means a numeral value which is integrated according to the progress of substrate processing. Processing Count may be set to, for example, an integration frequency (i.e., cumulative number of times) of film formation processing, a total time of the film formation processing, an integration value of the thickness of a film formed by the film formation processing, or an integration frequency of a cycle frequency (i.e., number of cycles) in iterative processing in ALD processing. VT1 represents a time of a specific step of a recipe. Any step time can be adopted as VT1. The value of VT1 determined by the control parameter is set to 10 seconds. VC3 represents a cycle frequency of specific processing. Any step cycle can be adopted as VC3. The value of VC3 determined by the control parameter is set to 10 times. When the film formation processing of a substrate is started and Processing Count is equal to 1, −20% is used as the first modification value of VT1, and +20% is used as the first modification value of VC3. When Processing Count is equal to 2, −10% is used as the first modification value of VT1, and +10% is used as the first modification value of VC3. When Processing Count becomes 3 or more, the first modification value of VT1 is set to 0%, and the first modification value of VC3 is set to 0%. Accordingly, when Processing Count is equal to 3 or more, the modification based on the first modification value is not applied.

FIG. 3 shows another example of the first modification value table. The increase and decrease values of the cycle frequency of the film formation processing are shown on the column of Shift Cycle 1. For example, any ALD cycle can be adopted as Shift Cycle 1. It is shown on the column of HRF1 what percentage should be increased/decreased with respect to a voltage to be applied to the shower plate. Any RF power related parameters can be adopted as HRF 1. The value of Shift Cycle 1 determined by the control parameter is assumed to be 100 times. The value of HRF1 determined by the control parameter is assumed to be 300 W. When Processing Count is equal to 1, −2 is used as the first modification value of Shift Cycle 1, and +20% is used as the first modification value of HRF1. When Processing Count is equal to 2, −1 is used as the first modification value of Shift Cycle 1, and +10% is used as the first modification value of HRF1. When Processing Count becomes 3 or more, the first modification value of Shift Cycle 1 is set to 0%, and the first modification value of HRF1 is set to 0%. Accordingly, when Processing Count becomes 3 or more, the modification based on the first modification value is not applied.

FIG. 4 shows another example of the first modification value table. The cycle frequency of the film formation processing is shown on the column of Shift Cycle 1. When Processing Count is equal to 1, the value of Shift Cycle 1 is equal to 105 times. When Processing Count is equal to 2, 3 and 4, the values of Shift Cycle 1 are equal to 104 times, 103 times and 102 times, respectively.

FIG. 5 shows another example of the first modification value table. Total Thickness means an integration value of the thickness of a film formed by the film formation processing. The expressions of Shift Cycle 1 and HRF1 are the same as FIG. 3. When the first modification value table of FIG. 5 is used, Shift Cycle 1 and HRF1 vary depending on the increase of the integration value of the thickness of the film formed by the film formation processing. When the integration value is equal to 0, −2 is used as the first modification value of Shift Cycle 1, and +20% is used as the first modification value of HRF 1. When the integration value is equal to 100, −1 is used as the first modification value of Shift Cycle 1, and +10% is used as the first modification value of HRF1.

FIG. 6 shows an example of a second modification value table. When the integration value of the processing count is equal to 1, +60% is used as the second modification value of VT1, and +20% is used as the second modification value of VC3. When the integration value is equal to 11, 21, and 31, +50%, +40% and +30% are used as the second modification value of VT1, respectively. When the integration value is equal to 11, +10% is used as the second modification value of VC3.

The first modification value and the second modification value may be set, for example, according to the integration frequency of the film formation processing, the total time of the film formation processing, the integration value of the thickness of the film formed by the film formation processing, or the integration frequency of the cycle frequency of the iterative processing in the ALD processing. The first modification value is configured by, for example, a group of modification values, and the second modification value is configured by, for example, a group of modification values.

An expression method for the first modification value and the second modification value may be, for example, a percentage, an increase/decrease value or a modified parameter. The first modification value has a shorter term for modifying the control parameter than the second modification value. Accordingly, the first modification value suppresses variation of the film thickness which finishes in a relatively short term, and the second modification value suppresses variation of the film thickness over a relatively long term. In this example, the control parameter is modified by using both the first modification value and the second modification value, thereby suppressing both the short-term film thickness variation and the long-term film thickness variation.

The control parameter may be set to, for example, the cycle frequency of iterative processing in ALD recorded in a recipe, the cycle frequency of a step of the recipe, the time of the step or an analog output. In addition, in case where the thickness of the formed film varies due to control of a device by iterative and continuous use of a control parameter, the control parameter may be set as a target of the modification based on the first modification value and the second modification value.

FIG. 7 is a diagram showing an example of a table stored in the storage medium 10a. For example, tables A, B and C of the first modification value and a table D of the second modification value are stored in the storage medium 10a. The table A is a table of the first modification value for moderating variation occurring in a processing result of a substrate after restart of the processing of the substrate due to long-term stop of the processing of the substrate by a device. The table B is a table of the first modification value for moderating variation occurring in a processing result of a substrate after restart of the processing of the substrate due to short-term stop of the processing of the substrate by the device. The table C is a table of the first modification value for moderating variation occurring in a processing result of a substrate after cleaning and pre-coat due to the cleaning and pre-coat of a reactor chamber in which the substrate is processed. Both the stop of the processing of the substrate, and the cleaning and pre-coat cause the variation of the film thickness which finishes in a relatively short term.

The computer 10b selects any one of the tables A, B and C as plural first modification values. The controller 10 selects one first modification value from the plural first modification values based on the state of the reactor chamber just before the processing of the substrate is started, and uses the selected first modification value. Specifically, the controller 10 selects the table A as the first modification value when the reactor chamber just before the processing of the substrate is started has stopped for a time longer than a predetermined time. The controller 10 selects the table B as the first modification value when the reactor chamber just before the processing of the substrate is started has stopped for a time shorter than the predetermined time. The controller 10 selects the table C as the first modification value when cleaning and pre-coat of the reactor chamber are performed just before the processing of the substrate is started. In this example, since the second modification value is only the table D, the controller 10 selects the table D as the second modification value. However, when there are plural second modification values, any one of the second modification values is selected. In this example, three first modification values and one second modification value are shown, but candidates of modification values may be further multiplied.

It is shown in the example of FIG. 7 that the table C is selected as the first modification value and the table D is selected as the second modification value. For example, the table C is the table of FIG. 2, and the table D is the table of FIG. 6. In the stage of Processing Count 1, "10 seconds" which is the value of VT1 determined by the control parameter is modified with the first modification value "−20%" and the second modification value "+60%". A specific calculation formula is as follows.

10[seconds]×0.8×1.6=12.8[seconds]

In this example, the value of "10 seconds" determined by the control parameter is modified with the first modification value and the second modification value, and "12.8 seconds" is obtained as a modified parameter. The controller 10 outputs an instruction to the controller 12 so as to control the device with VT1 set to 12.8 seconds, and the controller 12 controls the device according to the instruction.

When Processing Count advances to 2, "10 seconds" which is the value of VT1 determined by the control parameter is modified with the first modification value "−10%" and the second modification value "+59%". Such second modification value "+59%" may be calculated by linear interpolation. A specific calculation formula is as follows.

10[seconds]×0.9×1.59=14.31[seconds]

14.31 [seconds] is a modified parameter. The controller 10 outputs an instruction to the controller 12 so as to control the device with VT1 set to 14.31 seconds, and the controller 12 controls the device according to the instruction. The same processing is also advanced when processing Count is equal to 3 or more. As described above, the substrate processing apparatus can make the film thickness and film quality of a film formed on the substrate substantially constant. In FIG. 5, etc., the modified parameter may be calculated by linearly interpolating the modification value at a timing when the integration value of the thickness of the film formed by the film formation processing is not equal to a multiple of 100.

Figure 8:
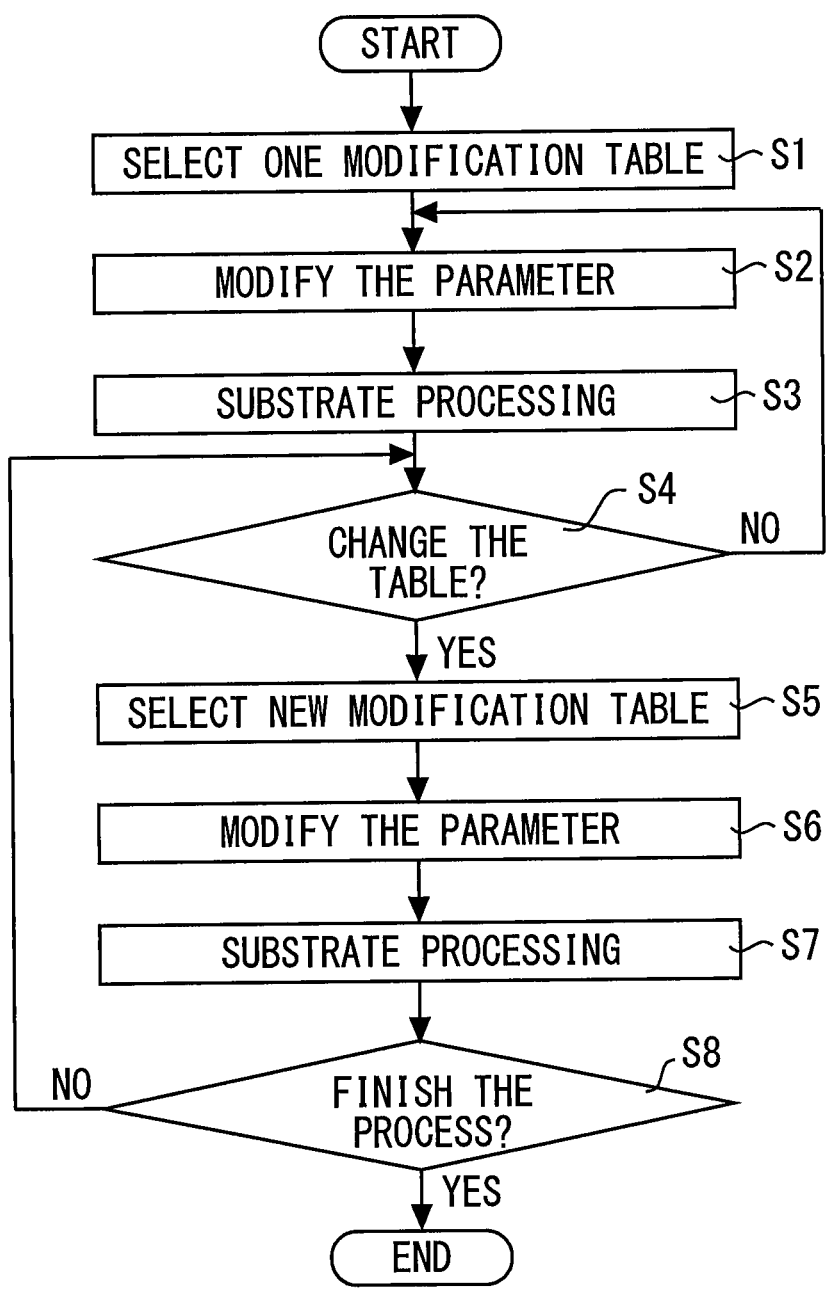
FIG. 8 is a flowchart showing an example of a substrate processing method.

FIG. 8 is a flowchart showing an example of a substrate processing method. First, one first modification value and one second modification value are selected in step S1. The modification values are not limited to the foregoing table, but may be a function having Processing Count as a variable. Subsequently, in step S2, a control parameter predetermined to control the device is modified with the selected first modification value and second modification value to calculate a modified parameter.

Subsequently, the device is controlled based on the modified parameter in step S3. For example, a film is formed on a substrate by controlling the device based on the modified parameter. In step S2, modified parameters corresponding to all of Processing Counts until the substrate processing is stopped are calculated, and the processing corresponding to Processing Count can be executed in step S3. Alternatively, a modified parameter corresponding to one Processing Count may be calculated in step S2, and after step S3 is finished, the processing may be returned to step S2 to calculate a modified parameter corresponding to next Processing Count.

Since the first modification value has a shorter term for modifying the control parameter than the second modification value, the control parameter is modified based on both the first modification value and the second modification value until some stage of the substrate processing, but the control parameter is thereafter modified with only the second modification value.

A series of substrate processing is completed by executing the processing up to step S3. For example, the film formation for wafers of one lot is completed. When going up to step S3, the substrate processing is temporarily stopped. The stop of the processing occurs due to waiting for replacement of a wafer or cleaning and pre-coat of the chamber.

In step S4, it is determined whether the first modification value and the second modification value are necessary to be changed. This determination is performed based on the state of the reactor chamber just before the substrate processing is restarted. For example, when there is a waiting time of the apparatus longer than a predetermined time, the table A described above is selected. When there is a waiting time of the apparatus shorter than the predetermined time, the table B described above is selected. When there are cleaning and pre-coat, the table C is selected.

When it is determined in step S4 that it is unnecessary to change the modification value, it is unnecessary to calculate a modified parameter again. On the other hand, when it is determined in step S4 that it is necessary to change the modification value, the modification value is changed in step S5, and a modified parameter is calculated based on the changed modification value in step S6. Thereafter, in step S7, the device is controlled based on the modified parameter obtained in step S6. When a series of processing based on the modified parameter is finished, it is determined in step S8 whether the processing is finished or not.

Figure 9:
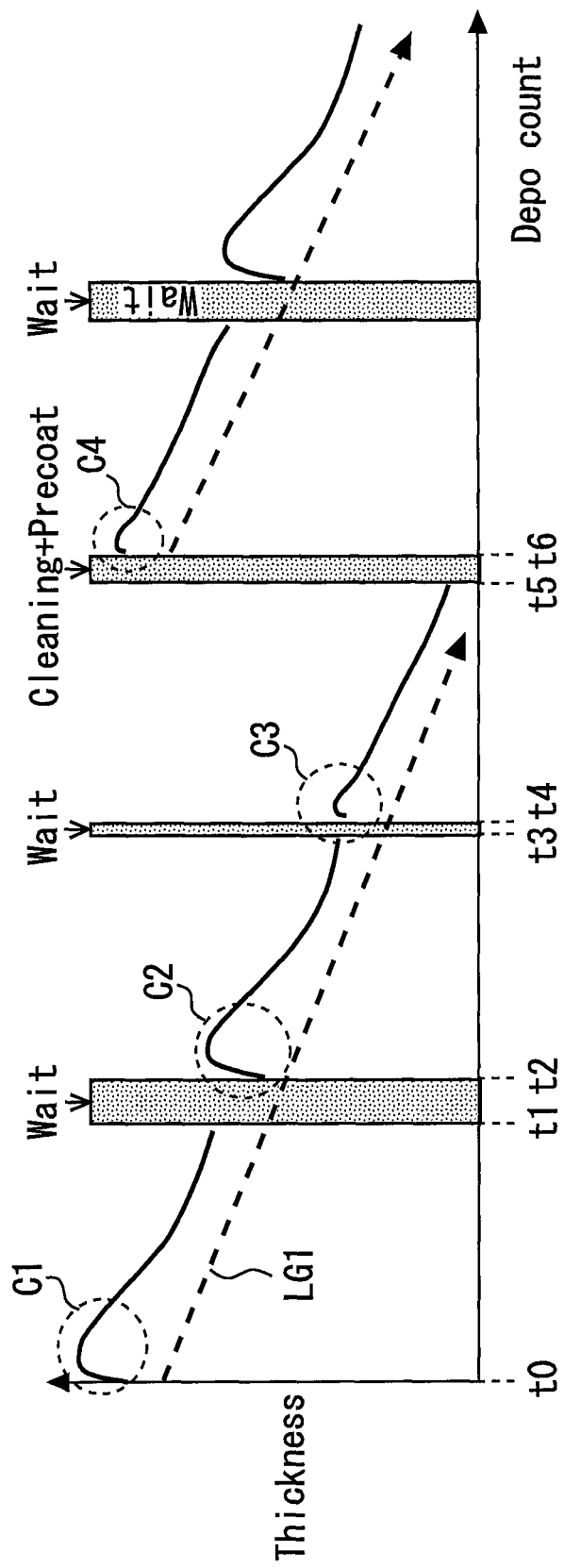
FIG. 9 is a diagram showing an example of the variation of the thickness of the film formed on the substrate over the time.

FIG. 9 is a diagram showing an example of the variation of the thickness of the film formed on the substrate over the time. For example, the film formation processing of plural times is performed on the substrate for the period from time t0 till time t1. Broken lines LG1 indicate variations of the film thickness and film quality which depend on the film formation frequency or accumulated film thickness after cleaning processing of the chamber, for example. The broken line LG1 shows that the thickness of the formed film decreases as the frequency of the substrate processing increases. The decrease of the film thickness as described above occurs, for example because the impedance of an electrode of a film forming apparatus increases due to deposition of a film on the electrode, so that substantial RF power decreases. The decrease of the film thickness over the time as described above is suppressed by the modification of the control parameter based on the second modification value.

Solid lines indicate that the film thickness of the formed film decreases as the integration frequency of the film formation processing increases when the device is processed without modifying the control parameter. Out of the solid lines, a portion surrounded by a broken line C1 indicates an increase of the film thickness which starts just after start of the substrate processing and finishes in a relatively short term. The increase of the film thickness finishing in a relatively short term as described above is suppressed by the modification of the control parameter based on the first modification value.

The reactor chamber stops for a time longer than a predetermined time between time t1 and time t2. In this case, the controller 10 selects the table A as the first modification value, and restarts the processing. As a result, it is possible to suppress an increase of the film thickness which is surrounded by a broken line C2, starts just after restart of the substrate processing and finishes in a relatively short term.

The reactor chamber stops for a time shorter than a predetermined time between time t3 and time t4. In this case, the controller 10 selects the table B as the first modification value, and restarts the processing. As a result, it is possible to suppress the increase of the film thickness which is surrounded by a broken line C3, starts just after restart of the substrate processing and finishes in a relatively short term.

Cleaning and pre-coat are performed on the reactor chamber between time t5 and time t6. In the cleaning, films formed on the susceptor and the shower plate due to repetitive film formation are removed. The susceptor and the shower plate are turned out to be exposed by the cleaning. In the pre-coat, thin films are formed on the susceptor and the shower plate, whereby the uniformity of a film to be formed can be enhanced and particles can be suppressed as compared with a case where the susceptor and the shower plate are exposed. The cleaning and pre-coat of the reactor chamber reset the decrease of the film thickness over the time, and cause the increase of the film thickness which starts just after restart of the substrate processing and finishes in a relatively short term. In this case, the controller 10 selects the table C as the first modification value, and restarts the processing. As a result, it is possible to suppress the increase of the film thickness which is surrounded by a broken line C4, starts just after restart of the substrate processing and finishes in a relatively short term. By suppressing the increase of the film thickness which starts at the start time of the substrate processing or just after restart of the substrate processing and finishes in a relatively short term, it is made unnecessary to perform the processing on a dummy wafer which is to prevent occurrence of the increase of the film thickness in a product wafer. There are various causes for the increase of the film thickness which starts at the start time of the substrate processing or just after restart of the substrate processing and finishes in a relatively short term, and the stop of the processing of the reactor chamber is cited as one example. It is considered that the stop of the processing of the reactor chamber may cause temperature variation of the susceptor or temperature variation of a gas line. In this example, the table D is selected as the second modification value during the whole period when the substrate processing is performed, thereby suppressing a long-term film-thickness variation.

The time for which the substrate processing has stopped, the cleaning and the pre-coat are cited as the causes for the increase of the film thickness which starts just after start of the substrate processing and finishes in a relatively short term. Plural first modification values are prepared since it is considered that the degree and term of the increase of the film thickness are different among these causes. Not only the tables A, B and C, but also other modification value tables may be prepared, and any modification value table may be selected according to the state of a device.

Each processing described above may be executed by software. Specifically, a program recorded in the storage medium 10a causes the computer 10b to execute each processing, which makes it possible to realize variation-suppressed substrate processing. For example, the following program is recorded in a computer-readable storage medium 10a.

The program causes a computer to execute: modifying a control parameter with a first modification value varying over the time and a second modification value that varies over the time and has a longer term for modifying the control parameter than the first modification value, thereby calculating a modified parameter, and controlling a device with the modified parameter.

In the foregoing example, the control parameter based on the recipe is modified with the first modification value for suppressing short-term variation of a processing result and a second modification value for suppressing a long-term variation of a processing result, thereby providing a modification system for film thickness and film quality from multiple perspectives.

The invention claimed is:

1. A substrate processing apparatus comprising:
a device for subjecting a substrate to processing; and
a controller, the controller including a processor communicatively coupled to a computer-readable storage medium that
stores a plurality of first tables and at least one second table, each first table including aa plurality of first modification values, and the at least one second table including a plurality of second modification values, the first modification values and the second modification values each varying independently over time, and
has a program recorded therein, the program causing the processor to execute:
selecting one first table from among the plurality of first tables,
modifying a control parameter to control the device with the respective first modification values corresponding to the selected first table and the second modification values corresponding to the at least one second table, thereby calculating a modified parameter, and
controlling the device based on the modified parameter, wherein
each first modification value has a shorter term for modifying the control parameter than the second modification values,
each first modification value moderates variation occurring in a processing result of the substrate after restart of the processing of the substrate due to stop of the processing of the substrate by the device,
the plurality of first tables include at least a table including a first modification value to be used when the processing of the substrate has been stopped for a time shorter than a predetermined time, a table including a first modification value to be used when the processing of the substrate has been stopped for a time longer than the predetermined time, and a table including a first modification value to be used when a cleaning and pre-coat are performed just before the processing of the substrate is started, and
each first modification value is used for modifying the control parameter to suppress an increase of a film thickness over time based on the restart of the processing, and
each second modification value is used for modifying the control parameter in order to suppress a decrease of a film thickness over time in a case where the processing of the substrate is performed after the cleaning and pre-coat resets the decrease of the film thickness.

2. The substrate processing apparatus according to claim 1, wherein
the control parameter is a cycle frequency of iterative processing in ALD recorded in a recipe, a cycle frequency of a step of the recipe, a time of the step or an analog output.

3. The substrate processing apparatus according to claim 1, wherein
the first modification values and the second modification value are set according to an integration frequency of film formation processing, a total time of the film formation processing, an integration value of a thickness of a film formed by the film formation processing or an integration frequency of a cycle frequency of iterative processing in ALD processing.

4. The substrate processing apparatus according to claim 1, wherein
the first modification values and the second modification value are expressed in terms of a percentage, an increase/decrease value or the modified parameter.

5. The substrate processing apparatus according to claim 1, further comprising
a reactor chamber for subjecting the substrate to processing, wherein
the first modification value moderates variation occurring in a processing result of the substrate after cleaning and pre-coat of the reactor chamber due to the cleaning and the pre-coat.

6. The substrate processing apparatus according to claim 1, further comprising
a reactor chamber for subjecting the substrate to processing, wherein
the processor selects the selected first modification value based on a state of the reactor chamber just before the processing of the substrate is started.

7. The substrate processing apparatus according to claim 1, wherein each of the plurality of first tables is organized by processing count.

8. The substrate processing apparatus according to claim 7, wherein each subsequent first modification value corresponds with an increase in the processing count, and each subsequent first modification value is less than or equal to a previous first modification value.

9. The substrate processing apparatus according to claim 7, wherein each subsequent second modification value corresponds with an increase in the processing count, and each subsequent second modification value is less than or equal to a previous second modification value.

10. The substrate processing apparatus according to claim 7, wherein each subsequent first modification value and each subsequent second modification value corresponds with an increase in the processing count, and each subsequent first modification value is less than or equal to a previous first modification value and each subsequent second modification value is less than or equal to a previous second modification value.

11. The substrate processing apparatus according to claim 1, wherein the restart occurs just after initial start of the processing of the substrate.

12. The substrate processing apparatus according to claim 1, wherein the restart occurs after at least one wait time for replacement of the substrate with a different substrate.

13. The substrate processing apparatus according to claim 1, wherein the restart occurs a plurality of times, including just after initial start of the processing of the substrate and after at least one wait time for replacement of the substrate of a different substrate.

* * * * *